DUO-TRANSISTOR AMPLITUDE AND FREQUENCY SENSITIVE ELECTRONIC SWITCH

Filed Sept. 4, 1959

INVENTORS
RICHARD L. KITTRELL
ILMAR LUIK
JACK D. WELCH
BY Marvin Moody
ATTORNEY
RW Anderson
AGENT 3,038,089
Patented June 5, 1962

3,038,089

DUO-TRANSISTOR AMPLITUDE AND FREQUENCY SENSITIVE ELECTRONIC SWITCH

Richard L. Kittrell, Ilmar Luik, and Jack D. Welch, Cedar Rapids, Iowa, assignors to Collins Radio Company, Cedar Rapids, Iowa, a corporation of Iowa
Filed Sept. 4, 1959, Ser. No. 838,348
6 Claims. (Cl. 307—88.5)

This invention relates generally to electronic switching and more particularly to a type of electronic switch which is sensitive both to the magnitude of an input signal and the rate-of-change of magnitude of an input signal.

Electronic switching has been widely employed in the art to affect the control of signal flow in a signal path in response to the characteristics of a switch control voltage as to magnitude and/or rate-of-change of magnitude. Known electronic switches generally employ a plurality of diodes in a bridge arrangement wherein the signal path to be switched is so related to the bridge arrangement that a signal path is opened and closed in response to the conductivity states of the diodes. The diodes are thus employed as a gating arrangement wherein a bias is selectively applied to the diode to alter its impedance characteristic.

It is an object of the present invention to provide an electronic switch of the general type employing impedance control wherein the impedance of a signal path may be selectively changed in response to control signals exceeding a predetermined magnitude or a predetermined rate-of-change of magnitude.

A further object of the present invention is the provision of an electronic switching arrangement wherein a switching path is controlled in response to input signals of either polarity exceeding a predetermined magnitude or rate-of-change of magnitude.

Still a further object of the present invention is the provision of an electronic switching arrangement wherein the change-over from one conductive state to the other is effected rapidly at a predetermined threshold and wherein provisions are provided to readily change the threshold operating point by preselection of a minimum of controlled parameters.

The present invention is featured in the provision of a novel transistor switching circuit in conjunction with a direct-current magnetic amplifier wherein a low impedance path is provided for a signal to be controlled through the transistors in response to a control signal being beneath a predetermined magnitude and/or rate-of-change of magnitude. A further feature of the present invention is the development of a novel transistor biasing arrangement responsive to the output voltage characteristic of a magnetic amplifier wherein, due to saturation effects within the magnetic amplifier, a well-defined threshold control signal is developed in response to input signals wherein the magnetic amplifier output voltage remains at a predetermined maximum amplitude over a range of input signals beneath a predetermined magnitude and in which the magnetic amplifier output voltage characteristic falls to a predetermined lower amplitude in response to input signals exceeding this predetermined magnitude.

These and other features and objects of the present invention will become apparent upon reading the following description in conjunction with the accompanying drawing, in which.

Figure 1:
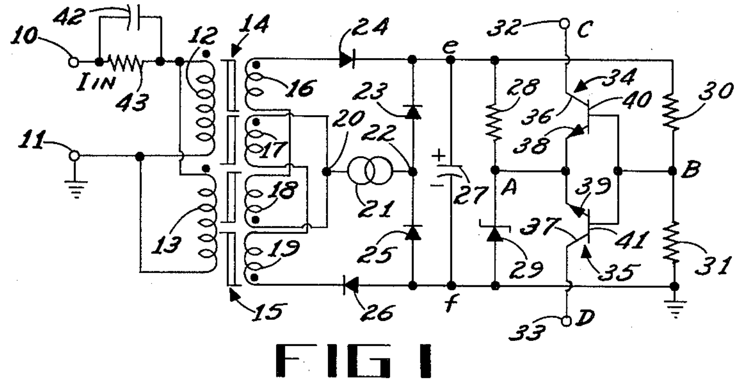
FIGURE 1 is a schematic representation of an electronic switching arrangement according to the present invention.

An embodiment of the elecronic switch is shown in FIGURE 1. The left-hand portion of the diagram illustrates a magnetic amplifier application which develops an output voltage characteristic across terminals *e* and *f* as illustrated graphically in FIGURE 2. The right-hand portion of the circuitry of FIGURE 1 includes a pair of transistors with a biasing control arrangement responsive to the voltage developed across terminals *e* and *f*. As above stated, the present invention provides a unique and selective control of the impedance characteristics of the transistors such that the impedance seen between terminals C and D may be selectively controlled in response to the characteristics of an input control signal applied to the amplifier portion of the switch. The present invention provides a low impedance between output terminals C and D until input control signals exceed a predetermined magnitude or rate-of-change of magnitude. When control signals exceed the predetermined magnitude or rate-of-change of magnitude, the impedance seen across output terminals C and D rises to a considerably higher value and thus terminals C and D act effectively as a switch which may be "opened" or "closed" depending upon the characteristics of the switching control signal.

Figures 2, 3:
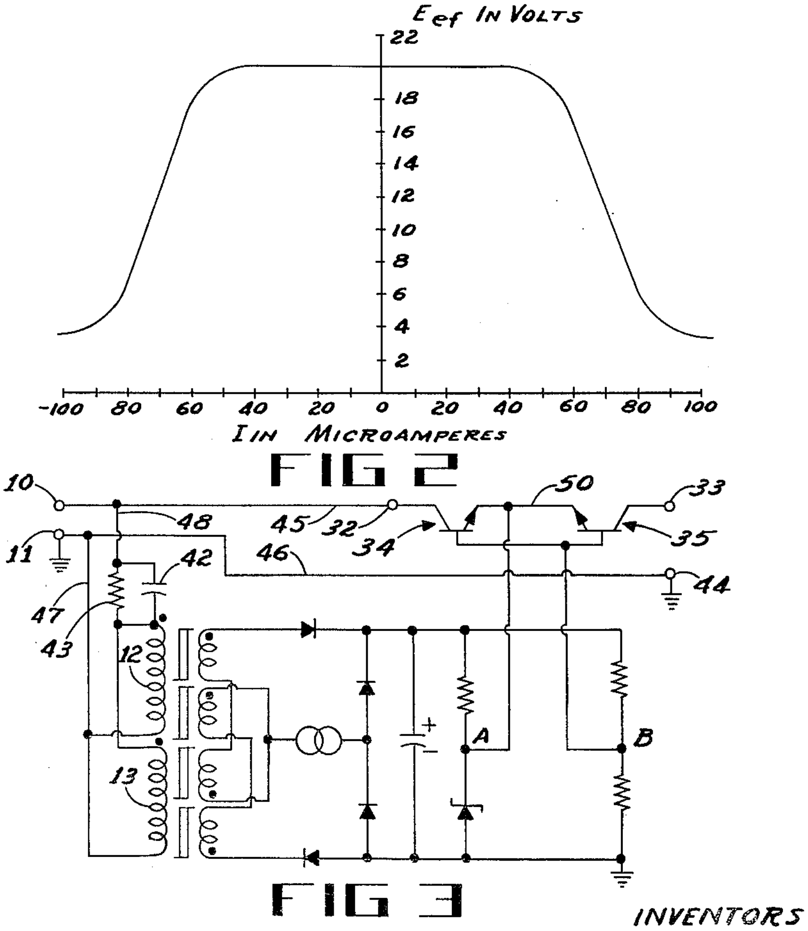
FIGURE 2 is a graphical representation of the output voltage characteristic controlling the electronic switch.
FIGURE 3 is a further schematic diagram of the electronic switching arrangement as incorporated in a signal control application.

The transistor arrangement of the present invention operates from the voltage characteristic of the amplifier portion as illustrated in FIGURE 2. The amplifier must be of the type that provides a maximum output voltage over a predetermined range of input signals and then falls off to a substantially lower output voltage as input signals exceed a given threshold. The magnetic amplifier arrangement in FIGURE 1 provides exacting control for this purpose. With reference to FIGURE 1, the magnetic amplifier is basically a full-wave application of two magnetic amplifiers. A pair of control windings 12 and 13 are seen to be connected in parallel across input terminals 10 and 11. An input resistor 43 is serially connected with each of the control windings 12 and 13, and a capacitor 42 shunts input resistor 43. The functioning of resistor 43 and capacitor 42 will be further described. Control winding 12 is wound about a pair of saturable core members 14 while control winding 13 is wound about a second pair of saturable core members 15. Each of the core members in the pairs 14 and 15 has wound thereon a power or gate winding. Gate windings 16 and 17 are seen to be respectively wound about each of the core members 14, and gate windings 18 and 19 are wound respectively about each of the core members 15. Gate windings 16, 17, 18, and 19 are serially interconnected in the sequence 16, 18, 17, and 19 as illustrated. An alternating-current gating source 21 is connected between junction points 20 and 22. A pair of unilateral conduction devices 23 and 24 are serially connected with opposite polarization between junction points 22 and the top of gate winding 16, while a second pair of unilateral conduction devices 25 and 26 are serially connected between junction point 22 and the bottom of gate winding 19. The latter unilateral conduction devices are mutually oppositely polarized and collectively oppositely polarized with respect to unilateral conduction devices 23 and 24. A capacitor 27 is connected between points *e* and *f*, which points connect respectively to the junctions between unilateral conduction devices 23 and 24 and unilateral conduction devices 25 and 26. In the absence of an input signal being applied through control windings 12 and 13, the gate winding arrangement develops a full-wave output characteristic sufficient to charge capacitor 27 to a predetermined maximum value. The characteristic of a given embodiment is illustrated in FIGURE 2 wherein the maximum voltage $E_{ef}$ is seen to be approximately 20 volts which is held substantially constant over an input signal range of approximately 60 microamperes of either polarity. As the input signal is increased, the voltage $E_{ef}$ is seen to drop off to approximately 5 volts as the input signal is increased to 80 microamperes. The magnetic amplifier is so designed that in the absence of input control signal, the core members 14 and 15 are driven beyond saturation by the gating source 21. Thus a predetermined input threshold must be attained before the magnetic amplifier output characteristic may be altered. The winding polarities of the control windings 12 and 13 and the gating windings 16—19 are such that one pair of gate windings, 16—17 or 18—19, is oppositely polarized with respect to its associated control winding while the remaining pair is like polarized with respect to its associated control winding. With the polarities indicated in FIGURE 1, control windings 12 and 13 are like polarized and gate windings 16 and 17 are polarized opposite to that of gate windings 18 and 19. Alternatively, control windings 12 and 13 may be oppositely polarized in which case it can be seen that the gate windings 16, 17, 18, and 19 would be all like polarized. With this winding arrangement and polarity requirements being met, the core members 14 and 15, which are saturated in the absence of input control signal, may be selectively driven back out of saturation upon a predetermined input signal threshold being attained. In the presence of input control current, one set of core members 14 and 15 is then always driven further into saturation with no effect upon the output while the remaining set of core members is driven out of saturation to a degree. It may be seen that the signal flow path with respect to the gate circuitry is such that signal flows during one half-cycle of gating source 21 through diode 23, capacitor 27, diode 26, gate winding 19, and gate winding 17, while during the other half-cycle of the gate source 21, current flows through gate winding 18, gate winding 16, diode 24, capacitor 27 and diode 25. Signal flow during each half-cycle of the gate source 21 is thus seen to include one gate winding of each pair. Thus in the presence of input control current during one half-cycle of the gate source 21, one set of cores 14 or 15 is driven further into saturation with no effect. However, the other set of cores is set back. If either pair of cores is set back, the output $E_{ef}$ across capacitor 27 reduces. As input control signal is increased, the output voltage characteristic falls sharply to the lower amplitude as illustrated in FIGURE 2 with the cores 14 and 15 being driven further and further out of saturation. The rapid fall-off of the characteristic is due to the inherent square hysteresis characteristics of the cores.

The amplifier portion of the electronic switch is thus seen to provide a direct-current output characteristic of a fixed polarity across capacitor 27 which remains at a constant maximum value until the input control current exceeds a predetermined value whereupon the output voltage characteristic drops off sharply to a second lower output carrying the same polarity due to the arrangement of the magnetic amplifier gate windings and gating diodes. The amplifier portion is seen to be magnitude sensitive but not polarity sensitive as concerns the input signal. The output characteristic $E_{ef}$ is made responsive to rate-of-change of input signal by the inclusion of capacitor 42 shunting the input resistance 43. It may be further seen that input resistance 43 may be preselected so as to cause the output characteristic $E_{ef}$ to fall off at desired magnitudes of input current. The value of input capacitor 42 may be chosen to determine the rate of input control signal change which will cause the output characteristic $E_{ef}$ to drop to its lower value.

The output characteristic $E_{ef}$ is applied to the transistor biasing arrangement of the present invention to open and close the effective electronic switch. With reference to FIGURE 1, the voltage across capacitor 27 is seen to be applied through two voltage dividing networks; the first dividing network consists of resistance 28 and a zener diode 29 while the second voltage dividing network consists of resistances 30 and 31. The voltage at point A does not rise above the zener voltage. Thus a 4.7-volt zener diode might be incorporated whereby the voltage at point A remains at 4.7 volts. The voltage at point B between resistors 30 and 31 may, however, vary from a value beneath the zener voltage to one above the zener voltage depending upon the magnitude of the input control current applied to terminals 10 and 11. In the absence of input control signal, the maximum value of $E_{ef}$ is applied across both voltage dividers. Point A is held at the zener voltage of, for example, 4.7 volts and considering resistances 30 and 31 to be equal, point B would be at one-half the voltage $E_{ef}$ or 10 volts. The voltages at points A and B are applied to the arrangement of transistors 34 and 35 to selectively forward or reverse bias the emitter-base junction of each of the transistors in accordance with the respective magnitudes of the voltages at points A and B.

With reference to FIGURE 1, a first transistor 34 includes a collector terminal 36 connected to output terminal 32. A second transistor 35 includes a collector terminal 37 connected to output terminal 33. The base electrodes 40 and 41 of the transistors 34 and 35 are connected in common to junction point B while the emitter electrodes 38 and 39 are connected in common to junction point A. Thus in the illustrated example, the absence of input control signal on terminals 10 and 11 produces 20 volts across each of the voltage dividing networks and applies 10 volts to the bases 40 and 41 of the transistors from junction point B while applying the zener voltage of 4.7 volts to the emitters of the transistors. Since the transistors illustrated are of the NPN type, it is seen that the bases thereof are more positive than the emitters and thus the emitter base junction is forward biased and the junctions reflect a low impedance between output terminals C and D. Now as the predetermined input magnitude is attained, the amplifier output characteristic $E_{ef}$ falls off to the lower value of 5 volts. The voltage at junction point A remains at the zener diode voltage of 4.7 volts while junction point B falls to one-half of $E_{ef}$ or 2.5 volts. In this instance the emitter base junctions of the diodes 34 and 35 are reverse biased since the emitter is more positive than the base in each instance and a correspondingly high impedance is seen between output terminals 32 and 33. The transistors 34 and 35 thus form a switch across the output terminals 32 and 33 whereby a low impedance signal path is provided between terminals 32 and 33 until the input control signal applied to terminals 10 and 11 exceeds a predetermined magnitude whereupon the resulting reverse biased transistors reflect a high signal-blocking impedance between output terminals 32 and 33.

It is thus seen that with the amplifier portion of the switch producing the output characteristic of FIGURE 2 that the transistors 34 and 35 may be rendered conductive or non-conductive due to the voltage divider biasing arrangement in response to the magnitude characteristic of an input control signal applied to amplifier input terminals 10 and 11.

An application of the electronic switch above described is illustrated in FIGURE 3. The electronic switch of this inventtion might be used to monitor an input signal as obtained from an input source and to control its application to an output terminal in accordance with its amplitude and/or rate characteristic. This type of application finds a special usage in the selective incorporation of radio-defined course deviation signals in an autopilot wherein radio is to be included in an aircraft horizontal control signal development only when the signal is beneath a predetermined magnitude and is not varying erratically. Such an application is illustrated basically in FIGURE 3 and is described in detail in a copending application entitled "Time Enabled Beam Sensing and Logic Circuitry for Horizontal Aircraft Guidance" by David O. McCoy and Ilmar Luik, assigned to the assignee of the present invention and filed concurrently with the present application.

With reference to FIGURE 3, an input signal may be applied to terminals 10 and 11. Input terminal 10 is connected through connector 45 and transistors 34 and 35 to output terminal 33. The common input terminal 11 is connected through connector 46 directly to the common output terminal 44. The present invention may then function to selectively apply the signal from input terminals 10 and 11 to output terminals 33 and 44, rejecting the signal should it exceed a predetermined magnitude or be varying erratically so as to exceed a predetermined rate-of-change of magnitude. With reference to FIGURE 3, the signal applied to input terminals 10 and 11 is seen to be also applied to the paralleled control windings 12 and 13 of the magnetic amplifier portion of the electronic switch. Junction points A and B are respectively connected as in FIGURE 1 to the common emitter circuit of the transistors 34 and 35 and to the common base circuit of the transistors 34 and 35. Considering the magnetic amplifier parameters and the transistor switching parameters above discussed, the signal across input terminals 10 and 11 will be passed to output terminals 32 and 33 through the low impedance forward-biased transistors 34 and 35 until the input signal exceeds the predetermined magnitude whereupon the transistors 34 and 35 are reverse biased and present a signal-blocking high impedance between input terminal 10 and output terminal 33.

An electronic switch incorporating the amplifier characteristic of FIGURE 2 was found to be responsive by judicious choice of input resistance 43 to effect an opening of the electronic switch when the input current applied through control windings 12 and 13 exceeded ±80 microamperes. In this specific embodiment, gating signal source 21 was chosen as 26 volts A.C., output capacitor 27—6 microfarads, resistor 28—10,000 ohms, zener diode 29—4.7 volts, resistors 30 and 31—6190 ohms, and transistors 34 and 35 were NPN type 2N333.

Although the present invention has been described with respect to a particular embodiment thereof, it is not to be so limited as changes might be made therein which are within the intended scope of the invention as defined by the appended claims.

We claim:

1. An electronic switch operative in response to an input control signal comprising a signal translating means, said input control signal applied to said translating means, said translating means being adapted to provide an output signal having a predetermined polarity and having a predetermined maximum amplitude for input control signals beneath a predetermined magnitude, said translating means being adapted to maintain said predetermined maximum amplitude for input control signals both positive and negative in polarity wtih respect to common ground, said translating means producing a substantially lower output having said predetermined polarity in response to input signals exceeding said predetermined magnitude, first and second voltage dividing means connected between the output of said translating means and common ground, the first of said voltage dividing means producing an output directly proportional to said translating means output, the second of said voltage dividing means including voltage clamping means and producing an output not exceeding a predetermined threshold, said first and second voltage dividing means being adapted such that the output from said first one thereof is variable in proportion to said translating means output through a voltage range bracketing the threshold voltage determined by said clamping means, first and second switch terminals, first and second junction transistors having like first electrodes individually connected to said first and second switch terminals respectively, like second electrodes of each of said transistors connected in common to the output of said second voltage dividing means, the common junction of each of said transistors each connected to the output of said first voltage dividing means whereby said first and second transistors may be selectively forward and reverse biased in response to predetermined magnitudes of said input control signals.

2. An electronic switch operative in response to an input control signal comprising a signal translating means, said input control signal applied to said translating means, said translating means being adapted to provide an output signal having a polarity and having a predetermined maximum amplitude for input control signals beneath a predetermined magnitude, said translating means being adapted to maintain said predetermined maximum amplitude for input control signals both positive and negative in polarity with respect to common ground, said translating means producing a substantially lower output having said predetermined polarity in response to input signals exceeding said predetermined magnitude, first and second voltage dividing means connected between the output of said translating means and common ground, the first of said voltage dividing means producing an output directly proportional to said translating means output, the second of said voltage dividing means including a resistive member and voltage clamping means respectively serially connected between said translating means output and common ground and producing an output not exceeding a predetermined threshold, said first and second voltage dividing means being adapted such that the output from said first one thereof is variable in response to said translating means output through a voltage range bracketing the voltage maintained by said clamping means, first and second switch terminals, first and second like junction transistors having first like electrodes individually connected to said first and second switch terminals respectively, like second electrodes of each of said transistors connected in common to the output of said second voltage dividing means, the common junction of each of said transistors each connected to the output of said first voltage dividing means, said transistors being selectively forward and reverse biased in response to said input control signals being less than and exceeding said predetermined magnitude respectively, an input resistance member serially inserted between said input control signal and said translating means, a capacitor shunting said input resistance member, said input resistance member and shunting capacitor respectively determining said predetermined input signal amplitude and rate-of-change of said amplitude to affect said reversal of bias on said transistors.

3. An electronic switch operative in response to an input control signal comprising a magnetic signal translating means having control and power windings, a power source, a plurality of saturable core members, said input control signal applied to said control windings, said power source normally saturating said core members to provide an output signal having a predetermined polarity and having a predetermined maximum amplitude, said translating means being non-responsive to input control signals of positive and negative polarity beneath a predetermined magnitude, said translating means being less saturated and producing a substantially lower output having said predetermined polarity in response to input signals exceeding said predetermined magnitude, first and second voltage dividing means connected between the output of said translating means and common ground, the first of said voltage dividing means producing an output directly proportional to said translating means output, the second of said voltage dividing means including voltage clamping means and producing an output not exceeding a predetermined threshold, said first and second voltage dividing means being adapted such that the output from said first one thereof is variable in response to said translating means output through a voltage range bracketing the threshold voltage determined by said clamping means, first and second switch terminals, first and second junction transistors having first electrodes individually connected to said first and second switch terminals respectively, like second electrodes of each of said transistors connected in common to the output of said second voltage dividing means, the common junction of each of said transistors each connected to the output of said first voltage dividing means whereby said first and second transistors may be selectively forward and reverse biased in response to predetermined magnitudes of said input control signals, input signal control means comprising a resistance and shunting capacitor serially connected between said input control signal and said control windings, the respective values of said resistance and capacitor determining said predetermined input signal amplitude and rate-of-change thereof in response to which said transistors are reverse biased.

4. An electronic switch comprising a signal translating means having input and output terminals, a control signal applied to said input terminals, said signal translating means being adapted to produce a first output level with predetermined polarity responsive to control signals of either polarity being less than a predetermined magnitude and a second substantially lower output having said predetermined polarity responsive to control signals exceeding said predetermined magnitude, first and second voltage dividing means connected across the output terminals of said signal translating means, the first of said voltage dividing means including voltage clamping means whereby the output therefrom may not exceed a given level, the second of said voltage dividing means producing an output directly proportional to the output of said signal translating means, the output levels from said signal translating means being predetermined such that the output from said second voltage dividing means is respectively less than and in excess of the output from said first voltage dividing means in response to control signal magnitudes in excess of and less than said predetermined magnitude, first and second switch terminals, first and second like junction transistors each including a collector terminal, an emitter terminal, and a base terminal, the collector terminals of said transistors connected individually to said first and second switch terminals respectively, the emitter terminals of said transistors commonly connected to the output of one of said voltage dividing means, the base terminals of said transistors commonly connected to the output of the other voltage dividing means whereby said transistors are collectively forward and reverse biased in response to control signal magnitudes respectively less than and in excess of said predetermined magnitude.

5. An electric switch operative in response to an input control signal comprising a signal translating means, said input control signal applied to the input of said translating means, said translating means being adapted to provide an output signal having a predetermined polarity and having a predetermined maximum amplitude for input control signals beneath a predetermined magnitude, said translating means being adapted to maintain said predetermined maximum amplitude for input control signals both positive and negative in polarity with respect to common ground, said translating means producing a substantially lower output having said predetermined polarity in response to input signals exceeding said predetermined magnitude, first and second voltage dividing means connected between the output of said translating means and common ground, the first of said voltage dividing means producing an output directly proportional to said translating means output, the second of said voltage dividing means including a resistive member and voltage clamping means respectively serially connected between said translating means output and common ground and producing an output not exceeding a predetermined threshold, said first and second voltage dividing means being adapted such that the output from said first one thereof is variable in response to said translating means output through a voltage range bracketing the voltage maintained by said clamping means, first and second switch terminals, first and second like junction transistors having first like electrodes individually connected to said first and second switch terminals respectively, like second electrodes of each of said transistors connected in common to the output of said second voltage dividing means, the common junction of each of said transistors each connected to the output of said first voltage dividing means, said transistors being selectively forward and reverse biased in response to said input control signals being less than and exceeding said predetermined magnitude respectively, an input resistance member serially inserted between said input control signal and said translating means, a capacitor shunting said input resistance member, said input resistance member and shunting capacitor respectively determining said predetermined input signal amplitude and rate-of-change of said amplitude to affect said reversal of bias on said transistors, a controlled signal connected between said first switch terminal and common ground, a controlled signal output being taken between said second switch terminal and common ground whereby said controlled signal is selectively switched between said first and second switch terminals in accordance with the magnitude of said input control signal relative to said predetermined magnitude.

6. An electronic switch comprising magnetic signal translating means; said magnetic translating means comprising first and second pairs of saturable core members, first, second, third, and fourth gate windings, first and second control windings parallel connected and receiving a direct-current input control signal, each one of said control windings wound common to one of said pair of core members, said first and third gate windings wound individually about first ones of each of said pairs of core members, second and fourth ones of said gate windings wound individually about second ones of each of said pairs of core members, said first, second, third, and fourth gate windings respectively serially interconnected, an alternating-current gating power source having one terminal thereof connected to the junction between said second and third gate windings, first and second oppositely polarized diodes individually serially connected respectively between said first gate winding and a first translating means output terminal and between said fourth gate winding and a second translating means output terminal, a third diode connected between the remaining terminal of said gating power source and said first translating means output terminal, said first and third diodes having a like pole common to said first translating means output terminal, a fourth diode connected between the remaining output terminal of said gating power source and said second translating means output terminal, said second and fourth diodes having a like pole common to said second translating means output terminal, a load capacitor connected between said first and second translating means output terminals, a first one of said control windings being like polarized with respect to the associated pair of gate windings, the second of said control windings being oppositely polarized with respect to the associated pair of gate windings; said magnetic translating means being adapted to produce an output signal having a pretermined polarity and a predetermined maximum amplitude for input control signals beneath a predetermined magnitude and to produce a substantially lower output having said predetermined polarity in response to input control signals exceeding said predetermined magnitude, first and second voltage dividing means connected between the output of said translating means and common ground, the first of said voltage dividing means producing an output directly proportional to said translating means output, the second of said voltage dividing means including a resistive member and voltage clamping means respectively serially connected across said translating means output terminals and producing an output not exceeding a predetermined threshold, said first and second voltage dividing means being adapted such that the output from said first one thereof is variable in response to said translating means output through a voltage range bracketing the voltage defined by said clamping means, first and second switch terminals, first and second like junction transistors having first like electrodes individually connected to said first and second switch terminals respectively, like second electrodes of each of said transistors connected in common to the output of said second voltage dividing means, the common junction of each of said transistors each connected to the output of said first voltage dividing means, said transistors being selectively forward and reverse biased in response to said input control signals being less than and exceeding said predetermined magnitude respectively, an input resistance member serially inserted between said input control signal and said translating means control windings, a capacitor shunting said input resistance member, said input resistance member and shunting capacitor respectively determining said predetermined input control signal amplitude and rate-of-change of said amplitude to affect said reversal of bias on said transistors.

References Cited in the file of this patent

UNITED STATES PATENTS

| | | |
|---|---|---|
| 2,751,545 | Chase | June 19, 1956 |
| 2,891,172 | Bruce et al. | June 16, 1959 |
| 2,899,571 | Myers | Aug. 11, 1959 |